US006675338B1

(12) United States Patent
Golshan

(10) Patent No.: US 6,675,338 B1
(45) Date of Patent: Jan. 6, 2004

(54) INTERNALLY GENERATED VECTORS FOR BURNIN SYSTEM

(75) Inventor: Farideh Golshan, Mountain View, CA (US)

(73) Assignee: Sun Microsystems, Inc., Santa Clara, CA (US)

( * ) Notice: Subject to any disclaimer, the term of this patent is extended or adjusted under 35 U.S.C. 154(b) by 505 days.

(21) Appl. No.: 09/635,996

(22) Filed: Aug. 9, 2000

(51) Int. Cl.$^7$ .......................................... G01R 31/3183
(52) U.S. Cl. ..................................................... 714/739
(58) Field of Search .................. 714/724, 726–728, 714/733, 738, 739

(56) References Cited

U.S. PATENT DOCUMENTS

| | | | | |
|---|---|---|---|---|
| 4,713,605 A | * | 12/1987 | Iyer et al. ............... | 324/73.1 |
| 5,136,705 A | | 8/1992 | Stubbs et al. ............ | 395/575 |
| 5,367,685 A | | 11/1994 | Gosling ................... | 395/700 |
| 5,570,375 A | * | 10/1996 | Tsai et al. ................ | 714/727 |
| 5,604,756 A | | 2/1997 | Kawata .................... | 371/67.1 |
| 5,615,137 A | | 3/1997 | Holzmann et al. ...... | 364/578 |
| 5,748,964 A | | 5/1998 | Gosling ................... | 395/705 |
| 5,809,036 A | | 9/1998 | Champlin ................ | 371/22.31 |
| 5,825,785 A | * | 10/1998 | Barry et al. ............. | 714/732 |
| 6,006,345 A | * | 12/1999 | Berry, Jr. ................. | 714/718 |
| 6,367,044 B1 | * | 4/2002 | Komoike ................. | 714/739 |
| 6,370,665 B1 | * | 4/2002 | Noguchi .................. | 714/738 |
| 6,415,409 B1 | * | 7/2002 | Rhodes et al. ........... | 714/738 |

FOREIGN PATENT DOCUMENTS

| | | | |
|---|---|---|---|
| EP | 0 685 792 A1 | 5/1995 | .......... G06F/11/00 |
| WO | WO 98/19237 | 5/1998 | ............ G06F/9/46 |

OTHER PUBLICATIONS

David Basin "Java Bytecode Verification by Model Checking" System Abstract, pp. 492–495 IT–Research Security (TZ/FE34).

* cited by examiner

*Primary Examiner*—Albert Decady
*Assistant Examiner*—Cynthia Britt
(74) *Attorney, Agent, or Firm*—Thelen Reid & Priest LLP; Marc S. Hanish

(57) ABSTRACT

Internally generating test vectors on a microchip during a burnin stage allows for better toggle coverage while not requiring external memory. A test access port (TAP) controller which accepts signals from a user and indicates to a linear feedback shift register (LFSR) that the microchip is in the burnin stage. The LFSR then may generate a set of pseudorandom values using a polynomial. The values are then shifted one per clock cycle into the internal scan chain of flips-flops on the chip, which toggles the internal state of the chip. New pseudorandom values are also generated one-by-one during the shift. By using this approach, the internal states of the chip are toggled without the use of an external memory for the burnin system.

5 Claims, 2 Drawing Sheets

INTERNALLY GENERATED VECTORS FOR BURNIN SYSTEM

BACKGROUND OF THE INVENTION

1. Field of the Invention

The present invention relates to the field of microchip design. More specifically, the present invention relates to the use of internally generated vectors for the burnin system for testing a microchip.

2. The Background

When constructing a microchip, it is typical to run what is called a "burn-in" test on the circuits in the chip. Burn-in is a long, thorough, carefully controlled preliminary test performed in order to stabilize a chip's electrical characteristics after manufacture and to ensure that it will function according to rated specifications. For microchips, a commonly run burn-in test is to run the chip at a high temperature for an extended period of time (such as 48 hours).

Microchips are often designed with test circuitry built-into the chip for use in the test phase of development. The circuitry not be used after shipment of the chip to customers, but the built-in circuitry allows tests to be performed by test facilities at a high rate of speed. A common test design is called a full scan design, which gives observability and controllability over internal states of the microchip to whoever is running the tests. When this capability is used along with the high temperature test, this allows every state of every flip-flop in the circuit to be tested at the high temperature, and oftentimes will reveal a problem in design or manufacture that no other test uncovered.

The goal in designing good test circuitry in this area, therefore, is to be able to toggle as many internal nodes of the microchip as possible during the burn-in stage in order to make the whole chip function during testing, which provides the maximum amount of stress testing of the microchip. This has generally been accomplished by designing the test circuitry to utilize automatic test pattern generation (ATPG) vectors generated by a software tool accompanying the microchip. The ATPG vectors are loaded into a memory, and then sequentially fed to the microchip in order to test all the possible states of the flip-flops in the circuit during burnin.

There is limited memory, however, available in the burnin system. Adding external memory adds additional costs to the burnin process. What is needed is an efficient solution which allows for better toggle coverage while still utilizing the limited memory available.

SUMMARY OF THE INVENTION

Internally generating test vectors on a microchip during a burnin stage allows for better toggle coverage while not requiring external memory. A test access port a (TAP) controller which accepts signals from a user and indicates to a linear feedback shift register (LFSR) that the microchip is in the burnin stage. The LFSR then may generate a set of pseudorandom values using a polynomial. The values are then shifted one per clock cycle into the internal scan chain of flips-flops on the chip, which toggles the internal states of the chip. New pseudorandom values are also generated one-by-one during the shift. By using this approach, the internal states of the chip are toggle without the use of an external memory for the burnin system.

DETAILED DESCRIPTION OF A PREFERRED EMBODIMENT

In the following description, a preferred embodiment of the invention is described with regard to preferred process steps and data structures. However, those skilled in the art will recognize, after perusal of this application, that embodiments of the invention may be implemented using at least one general purpose computer operating under program control, and that modification of the general purpose computer to implement the components, process steps, and/or data structures described herein would not require undue invention.

In accordance with a presently preferred embodiment of the present invention, the components, process steps, and/or data structures are implemented on a microchip using logic circuitry. This implementation is not intended to be limiting in any way. Different implementations may be used and may include software, computing platforms, program storage devices and/or computer programs. In addition, those of ordinary skill in the art will readily recognize that devices of a less general purpose nature, such as hardwired devices, devices relying on FPGA (field programmable gate array) or ASIC (application specific integrated circuit) technology, or the like, may also be used without departing from the scope and spirit of the inventive concepts disclosed herewith.

In accordance with a specific embodiment of the present invention, a linear feedback shift register (LFSR) is implemented within the test circuitry on the microchip. The LFSR generates random test vectors and then shifts them into the internal scan chain of the chip. This allows all the possible states of the flip-flops in the internal scan chain to be toggled without utilizing a memory. The design of the LFSR allows the burnin process to be accomplished without the use of an external memory, and also provides for better toggle coverage.

Figure 1:
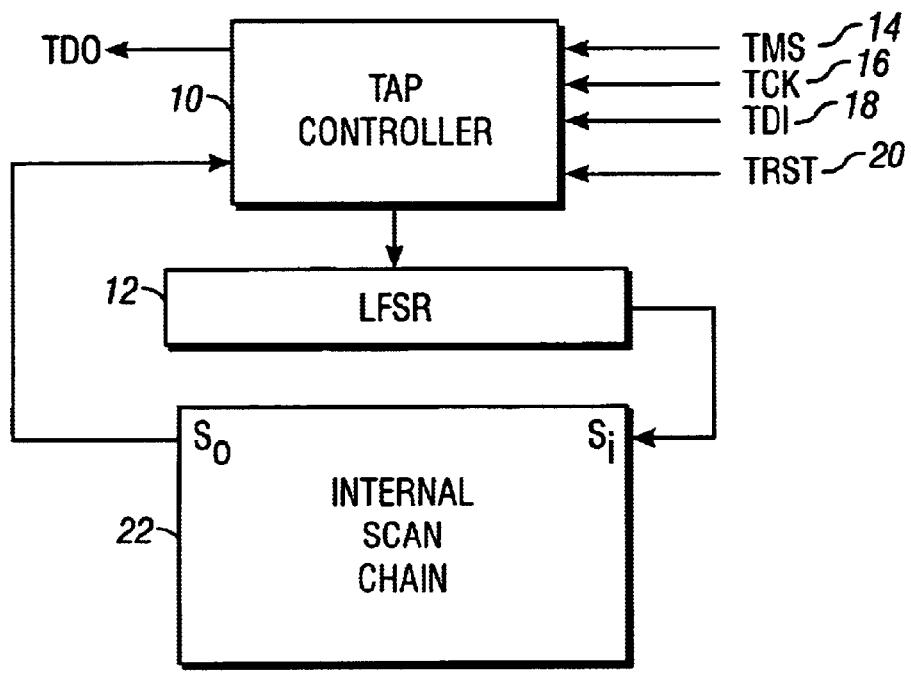
FIG. 1 is a block diagram illustrating an internally generated vector design for a microchip in accordance with a specific embodiment of the present invention.

FIG. 1 is a block diagram illustrating an internally generated vector design for a microchip in accordance with a specific embodiment of the present invention. A Test Access Port (TAP) Controller 10 is placed in the circuit. The TAP controller 10 operates to send control signals to an LFSR 12 indicating that the LFSR 12 should generate random test vectors. The TAP controller 10 also may operate to control other test circuits also placed on the microchip. It may take as input a test mode select (TMS) line 14, a test clock (TCK) line 16, a test data input (TDI) line 18 and a test reset (TRST) line 20.

A seed is setup prior to the burnin instruction activation. When control signals are received by the LFSR from the TAP Controller 10 indicating that random test vectors should be generated, the LFSR uses a polynomial to randomly generate the vectors. All random pattern sensitive circuitry may then be protected by enabling the control signals that force them into safe states. In a specific embodiment of the present invention, the polynomial used is $x^{32}+x^{22}+x^2+x+1$. The LFSR 12 sends test values to an internal scan chain of flip-flops 22, which tests the flip-flops, the output of the internal scan chain 22 leading back to the TAP Controller 10. The output will be available on a test data output (TDO) line from the TAP Controller 10.

Figure 2:
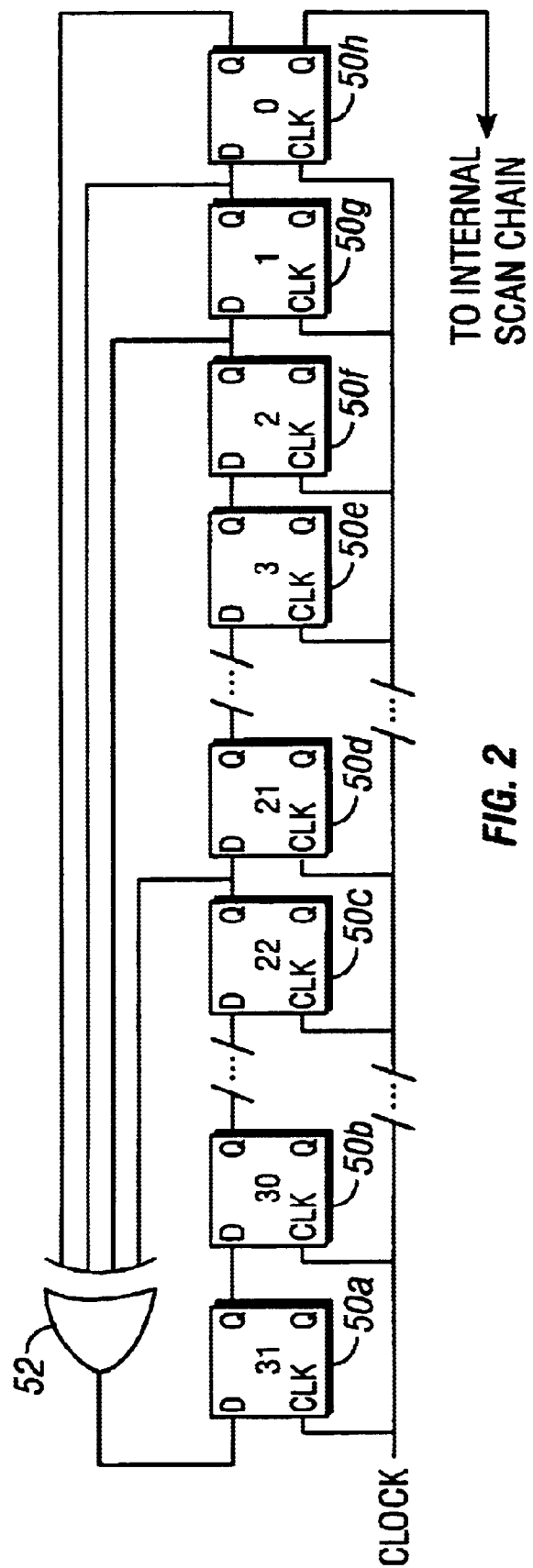
FIG. 2 is a logic diagram illustrating the design of a LFSR according to a specific embodiment of the present invention using the polynomial $x^{32}+x^{22}+x^2+x+1$.

FIG. 2 is a logic diagram illustrating the design of a LFSR according to a specific embodiment of the present invention using the polynomial $x^{32}+x^{22}+x^2+x+1$. Thirty-two flip-flops 50a–50h are coupled to each other, one for each of the thirty-two bits of the random number vector to be generated. An XOR gate 52 has an output connected to the first flip-flop 50a. One input of the XOR gate comes off the last flip flop 50h. Additionally, lines coming off of the flip flops in positions 22, 2, 1, and 0 are inputs to the XOR gate 52. This represents the polynomial (the output of the XOR gate 52 leads to the 32nd flip flop 50a, representing $x^{32}$, the outputs of flip flops in positions 22, 2, 1, and 0, 50c, 50f, 50g, 50h respectively, leads to the input of the XOR gate 32, representing $x^{22}$, $x^2$, x, and 1. Then the LFSR may generate random numbers according to the polynomial in the flip-flops a-50a–50h. After the random numbers are generated, they may be shifted out one at a time (with each clock cycle) to the flip-flops in the internal scan chain. This allows each permutation of states of the flip-flops in the internal scan chain to toggle. During a single clock cycle, a bit is shifted off the LFSR. Additionally, the first flip-flop then gets the output of the XOR gate 52, thus making the value in the first-flip flop a pseudorandom value based on the polynomial.

Figure 3:
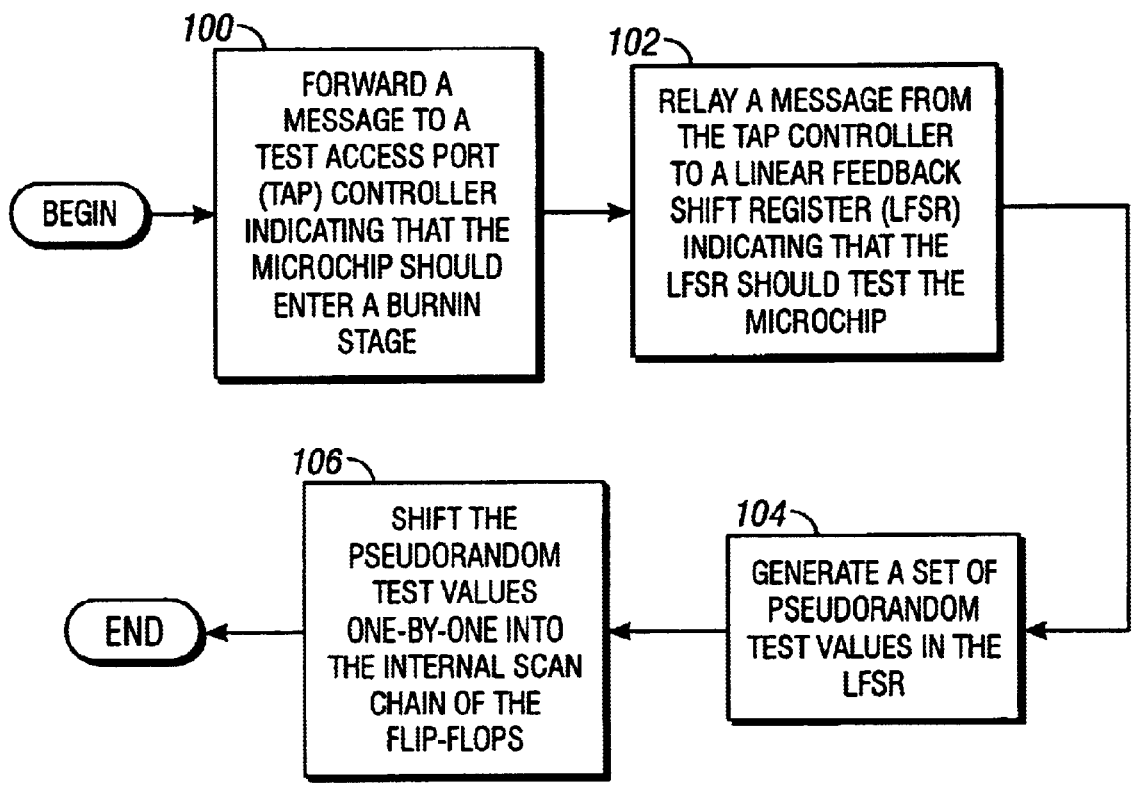
FIG. 3 is a flow diagram illustrating a method for testing an internal scan chain of flip-flops on a microchip in accordance with a specific embodiment of the present invention.

FIG. 3 is a flow diagram illustrating a method for testing an internal scan chain of flip-flops on a microchip in accordance with a specific embodiment of the present invention. At 100, a message is forwarded to a test access port (TAP) controller indicating that the microchip should enter a burnin stage. This includes using an instruction specifically designed for burnin. At 102, a message from the TAP controller may be relayed to a Linear Feedback Shift Register (LFSR) indicating that the LFSR should test the microchip. These may take the form of control signals. At 104, a set of pseudorandom test values may be generated in the LFSR. This may use the polynomial $x^{32}+x^{22}+x^2+x+1$. At 106, the pseudorandom test values may be shifted one-by-one into the internal scan chain of flip-flops, testing each flip-flop and toggling the nodes. This may occur once every clock cycle.

Thus the present invention allows for the toggling of the logic during a burnin stage by using internally generated vectors, eliminating the need for external. memory and therefore reducing overhead while producing better toggle coverage.

While embodiments and applications of this invention have been shown and described, it would be apparent to those skilled in the art having the benefit of this disclosure that many more modifications than mentioned above are possible without departing from the inventive concepts herein. The invention, therefore, is not to be restricted except in the spirit of the appended claims.

What is claimed is:

1. A microchip test design for internally generating test vectors during a burnin test including:
   a Test Access Port (TAP) controller having a first input, a second input, and an output;
   a Linear Feedback Shift Register (LFSR) having an input and an output, said input of said LFSR coupled to said output of said TAP controller, wherein said LFSR further includes an XOR gate having five inputs and an output, an output on each of a last, second-to-last, third-to-last, twenty-second-to-last, and first LFSR flip-flops coupled to an input of said XOR gate, said output of said XOR gate coupled to an input of said first LFSR flip-flop;
   one or more flip flops organized in an internal scan chain, a first of said one or more flip-flops having an input coupled to said output of said LPSR, a last of said one or more flip-flops having an output coupled to said second input of said TAP controller; and
   said TAP controller further including a test data output (TDO).

2. The microchip test design of claim 1, wherein said LSFR is designed to generate a pseuduorandom test vector based on a polynomial, wherein said polynomial is $x^{32}+x^{22}+x^2+x+1$.

3. The microchip test design of claim 1, wherein said TAP controller receives a message indicating that a microchip containing the microchip test design should enter a burnin stage.

4. The microchip test design of claim 3, wherein said TAP controller sends a message to said LFSR indicating that the LFSR should generate a test pattern to be used to test said microchip.

5. The microchip test design of claim 4, wherein said LFSR generates a set of pseudorandom test vectors in response to said message from said TAP controller.

* * * * *